US009266360B2

(12) United States Patent
Schadt et al.

(10) Patent No.: US 9,266,360 B2
(45) Date of Patent: Feb. 23, 2016

(54) LIGHTING UNIT WITH REFLECTOR

(71) Applicant: Heraeus Noblelight GmbH, Hanau (DE)

(72) Inventors: Susanne Schadt, Langenselbold (DE); Michael Peil, Otzberg (DE); Harald Maiweg, Korschenbroich (DE)

(73) Assignee: Heraeus Noblelight GmbH, Hanau (DE)

( * ) Notice: Subject to any disclaimer, the term of this patent is extended or adjusted under 35 U.S.C. 154(b) by 0 days.

(21) Appl. No.: 14/397,893

(22) PCT Filed: Mar. 14, 2013

(86) PCT No.: PCT/EP2013/000783
§ 371 (c)(1),
(2) Date: Oct. 30, 2014

(87) PCT Pub. No.: WO2013/164051
PCT Pub. Date: Nov. 7, 2013

(65) Prior Publication Data

US 2015/0130880 A1 May 14, 2015

(30) Foreign Application Priority Data

May 2, 2012 (DE) ........................ 10 2012 008 641

(51) Int. Cl.
*B41J 2/01* (2006.01)
*G03F 1/00* (2012.01)
(Continued)

(52) U.S. Cl.
CPC ........... *B41J 11/002* (2013.01); *B41F 23/0409* (2013.01); *B41F 23/0453* (2013.01); *F21V 13/04* (2013.01); *F21V 29/56* (2015.01); *F21Y 2101/02* (2013.01)

(58) Field of Classification Search
CPC .... B41J 11/002; F21Y 2101/02; F21V 13/04; F21V 29/56
USPC ............. 347/102; 430/320; 362/84, 228, 231, 362/235, 555
See application file for complete search history.

(56) References Cited

U.S. PATENT DOCUMENTS 7,237,927 B2 * 7/2007 Coushaine et al. ........... 362/554
2005/0281048 A1 12/2005 Coushaine et al.
(Continued)

FOREIGN PATENT DOCUMENTS

DE 102004015700 A1 11/2005
DE 102008010200 A1 9/2009
(Continued)

OTHER PUBLICATIONS

Int'l Search Report and Written Opinion issued Jul. 25, 2013 in Int'l Application No. PCT/EP2013/000783.
(Continued)

*Primary Examiner* — An Do
(74) *Attorney, Agent, or Firm* — Panitch Schwarze Belisario & Nadel LLP

(57) ABSTRACT

A lamp is provided including a first module and at least one second module, each having a plurality of LEDs distributed over a module surface. The modules are arranged on at least one cooling element for dissipation of lost heat. A reflector deflects light emitted by one of the modules into an exit opening of the lamp. An optical system located between at least some of the LEDs and the exit opening bundles the light of the LEDs into a defined structure on a target surface.

17 Claims, 1 Drawing Sheet

(51) Int. Cl.

| | |
|---|---|
| ***B41J 11/00*** | (2006.01) |
| ***B41F 23/04*** | (2006.01) |
| ***F21V 29/56*** | (2015.01) |
| ***F21V 13/04*** | (2006.01) |
| *F21Y 101/02* | (2006.01) |

(56) References Cited

U.S. PATENT DOCUMENTS

| | | | |
|---|---|---|---|
| 2008/0315132 | A1 | 12/2008 | Platsch |
| 2009/0160923 | A1 | 6/2009 | Custer |
| 2010/0309646 | A1 | 12/2010 | Morikawa et al. |
| 2010/0309659 | A1 | 12/2010 | Jenny |

FOREIGN PATENT DOCUMENTS

| | | | |
|---|---|---|---|
| DE | 102009017954 | A1 | 10/2009 |
| EP | 2284006 | A2 | 2/2011 |
| EP | 2375133 | A2 | 10/2011 |
| JP | S63131157 | U | 8/1988 |
| JP | H0768840 | A | 3/1995 |
| JP | 2005242364 | A | 9/2005 |
| JP | 2010512256 | A | 4/2010 |
| JP | 2010192347 | A | 9/2010 |
| JP | 2011224960 | A | 11/2011 |
| JP | 2012043852 | A | 3/2012 |
| WO | 2012031703 | A1 | 3/2012 |

OTHER PUBLICATIONS

Office Action issued Jan. 11, 2013 in DE Application No. 10 2012 008 641.5.

Office Action issued Aug. 24, 2015 in JP Application No. 2015509316.

* cited by examiner

LIGHTING UNIT WITH REFLECTOR

CROSS-REFERENCE TO RELATED APPLICATIONS

This application is a Section 371 of International Application No. PCT/EP2013/000783, filed Mar. 14, 2013, which was published in the German language on Nov. 7, 2013, under International Publication No. WO 2013/164051 A and the disclosure of which is incorporated herein by reference.

BACKGROUND OF THE INVENTION

The invention relates to a lamp comprising a first module and at least one second module each having a plurality of LEDs distributed over a module surface, wherein the modules are arranged on at least one cooling element for dissipation of lost heat, and a reflector, wherein light emitted from one of the modules is deflected by the reflector into an exit opening of the lamp.

European Application Publication No. EP 2 375 133 A2 describes a lamp having an air-cooled cooling element, in which two LED modules are arranged opposite from each other. The light of the two LED modules is collimated by collimators that are individually placed on the LEDs and is deflected by two deviating mirrors by 90° each into a joint exit direction. The light exiting from the lamp is fully divergent.

BRIEF SUMMARY OF THE INVENTION

The object of the invention is to devise a lamp that can be used to attain a high irradiation density with an optimized design.

The object is met through a lamp comprising a first module and at least one second module each having a plurality of LEDs distributed over a module surface, and a reflector. The modules are arranged on at least one cooling element for dissipation of lost heat. Light emitted by one of the modules is deflected by the reflector into an exit opening of the lamp. An optical system, located between at least some of the LEDs and the exit opening, bundles the light of the LEDs into a defined structure on a target surface.

Bundling via the optical system allows a large aperture angle of the individual LEDs to be bundled into the structure of the target surface. Moreover, deflecting the light via the reflector allows attaining a high flexibility in terms of shape and size of the lamp.

Specifically, the assembled position and size of the cooling element or cooling elements can be selected appropriately such that an installed height of the lamp in the exit direction of the light is reduced. Presently, the exit direction shall be understood to mean the main geometrical direction of the light after deflection and upon exiting from the exit opening.

It is generally advantageous to have the reflector or multiple reflectors deflect the light from multiple modules, which are in a different arrangement and/or emit light in different main directions, into the same exit direction from the lamp. Specifically, this can concern the deflection of the light from opposite modules with opposite emission directions, wherein the reflector or reflectors is/are arranged between the modules and deflect(s) the light, for example, by 90° each into the joint exit direction.

In the scope of the invention, an optical system shall be understood to mean any object positioned in the optical path by which a defined change in the propagation direction of the geometrical light beams can be attained. This concerns, in particular, lenses that are translucent for the light beams, including cylindrical lenses and Fresnel lenses. However, it can alternatively concern reflectors possessing a defined curvature. Likewise, a defined curvature of the deflecting reflector, by which a bundling into the defined structure is attained, is an optical system in the scope of the invention.

In a preferred embodiment of the invention, the optical system comprises a primary optical system for bundling the emitted light that is arranged right on the LEDs. A primary optical system of this type can be used to transport a particularly large spatial angle of the light that is usually emitted by the LEDs at a large angle. This can concern, for example, multiple collecting lenses that are each arranged above an LED.

In a preferred refinement, the primary optical system is a transparent polymer layer that is applied to the modules and extends, as one part, over at least multiple LEDs. A polymer layer of this type can be provided, for example, according to the optical systems described in International Application Publication No. WO 2012/031703 A1. In this context, an LED module is covered with a UV-resistant silicone in an open casting mold.

In an alternative or supplemental embodiment of the invention, the optical system comprises a secondary optical system that is arranged in an optical path of the light while being spatially separated from a module. For differentiation from the term “primary optical system”, a secondary optical system shall presently be understood to generally mean an optical system that is not positioned directly on the LEDs. Accordingly, embodiments comprising a secondary optical system, without a primary optical system, are feasible. In a preferred embodiment, both a primary optical system and a secondary optical system are arranged in the optical path of the lamp, which results in a particularly compact design at high irradiation intensity.

According to a preferred design detail, the secondary optical system is a transparent polymer layer on a transparent substrate. In this context, the secondary optical system can be manufactured like the optical systems described in WO 2012/031703 A1, wherein a transparent substrate, for example, glass, instead of an LED module, is covered with a UV-resistant silicone in an open casting mold.

It is generally advantageous for the optical system to comprise at least one cylindrical lens by which the light of a plurality of LEDs that are arranged in a row can be bundled. A cylindrical lens of this type can be located, in particular, in a secondary optical system that is arranged at a distance from the LEDs.

A preferred detailed embodiment of the invention provides the defined structure as a straight line. Preferably, but not necessarily, the lamp extends parallel to the straight line in a longitudinal direction in this context and has a length in this direction that is at least two times, preferably at least three times, an installed height of the lamp in an upward direction that is perpendicular to the longitudinal direction.

It is also advantageous to have the reflector arranged opposite from the LED module at an angle between 30° and 60°. Specifically, the angle can be approximately 45° such that, in total, the light beams are deflected by approximately 90°, which favors a low installed height of the lamp. In the scope of the invention, the reflector arranged at an angle shall be understood to refer to a deflection of a main beam of the bundle of light by twice this angle. In this sense, not only planar, but also curved reflectors, are arranged at a certain angle.

Preferably, the lamp is designed such that an irradiation intensity on the structure is at least 2 $W/cm^2$. This allows, in particular, for the use of drying facilities such as, for example, lacquer drying by UV light, as a component of a printing method.

Advantageously, at least 50% of the light emitted by the LEDs is in a wavelength range below 470 nm. This allows the lamp to be designed at least mainly as an UV emitter. Further combination of features according to an embodiment of the invention allows the UV emitter to be flexibly integrated into a technical device, for example, a printing machine.

Alternatively, at least 50% of the light emitted by the LEDs is in a wavelength range above 780 nm. This allows the lamp to be designed at least mainly as an IR emitter. Further combination of features according to an embodiment of the invention allows the IR emitter to be flexibly integrated into a technical device, for example, a printing machine.

The drying of lacquers and/or paints of printing machines is effected, depending on design, by UV light, which usually is associated with cross-linking of the substance to be dried, or by heat, wherein it is preferred to use IR emitters.

It is generally preferred to have an amount of heat transferred to the cooling element be taken up by a liquid coolant such that, in total, a particularly large amount of lost heat can be dissipated even if the assembly conditions of the lamp are unfavorable. Liquid coolants have a higher heat capacity than gaseous ones and allow for high cooling power. The dissipation can proceed by shifting the coolant in liquid phase, for example, via a circulated coolant cycle. Alternatively or supplementary, this can concern the use of heat pipes, in which the take-up of heat initially leads to a phase change of the liquid coolant.

The object of the invention is also met through a device for drying a coating, comprising a lamp according to an embodiment of the invention. The lamp according to an embodiment of the invention is particularly well-suited for this purpose, since it combines high irradiation intensities and flexibility and, in particular, compact design.

In a preferred refinement, a two-dimensional substrate bearing the coating to be dried and the lamp can be moved towards each other in a conveying direction, wherein the lamp extends at least partly over a width of the substrate in a transverse direction and is arranged at a defined distance above the substrate. This shall include scanning of the substrate surface in multiple runs. The substrate can, for example, be printed matter that is coated with lacquer or another substance being printed on it in a printing machine.

The object of the invention is also met through the use of a lamp according to an embodiment of the invention for drying a coating, preferably in a printing procedure.

Further advantages and features of the invention are evident from the exemplary embodiment described in the following as well as the dependent claims.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
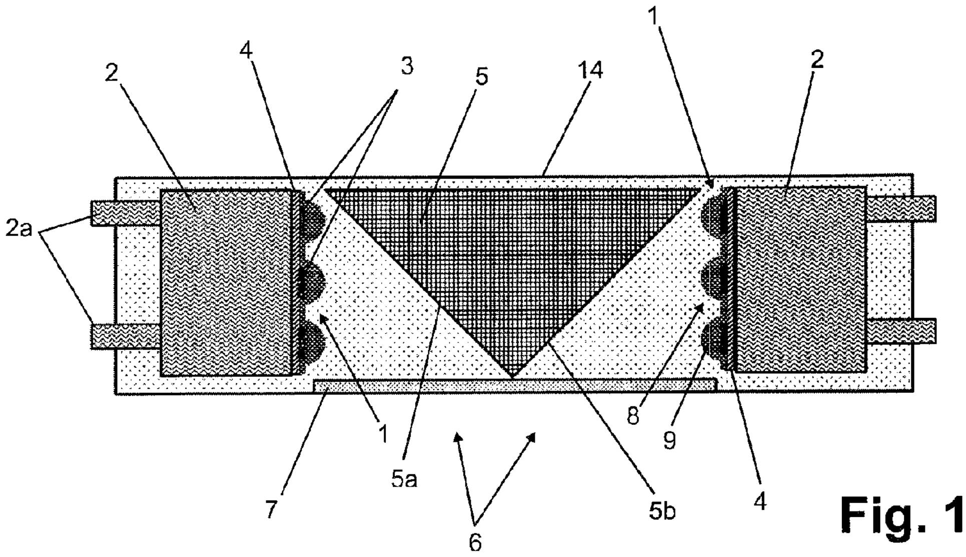
FIG. 1 is a schematic cross-sectional side view of a first exemplary embodiment of the invention.

An inventive lamp according to FIG. 1 comprises two LED modules 1, wherein each module 1 is applied to a cooling element 2 to produce a two-dimensional thermally conductive connection. The modules 1 each comprise multiple LEDs 3 distributed in an array across a module surface that extends perpendicular to the drawing plane. The LEDs 3 and further electronic components (not shown) are attached to a planar carrier 4, which, altogether, provide one chip-on-board (COB) module each. The modules 1 extend in a longitudinal direction, which extends parallel to the drawing plane, and in an upward direction, which extends from top to bottom in the drawing of FIG. 1 and corresponds to an exit direction from the lamp. Accordingly, a main emission direction of the LEDs 3 corresponds to a transverse direction that extends from left to right in the drawing of FIG. 1.

The sides of the modules 1 fitted with LEDs are opposite with respect to each other, and a reflector 5 is arranged between the modules 1. The reflector 5 comprises two reflector surfaces 5*a*, 5*b*, wherein, presently, each of the reflector surfaces is planar and is inclined at an angle of 45° with respect to the plane of the respective opposite module. Accordingly, a light beam originating from an LED at an angle of 90° with respect to the respective module plane (main beam direction) is deflected by the respective reflector surface 5*a*, 5*b* at an angle of 90° and exits from the lamp through an exit opening 6 in an exit direction that is parallel to the upward direction. The reflector can be designed at will, for example, as a prism, a glass mirror or a mirror plate. In order to minimize losses, an appropriate surface finish may be present in this context.

A primary optical system 8 is arranged on the modules 1, as a full-surface coating of the modules 1 in the present case. The primary optical system comprises lenses 9 directly on each of the individual LEDs 3, by which a large aperture angle of emitted light is being bundled and directed at a target surface 10 (see view shown and analogously extending optical paths in FIG. 2) by deflection by the reflector 5. This is associated with predominant bundling of the beams into a structure in the form of a straight line in the target surface 10 that extends in the longitudinal direction. The irradiation intensity produced on the structure by the lamp clearly exceeds 2 W/cm$^2$.

The exit opening 6 is covered by a transparent protective pane 7, which presently has no deflecting effect on the optical path. However, as a matter of principle, the protective pane can also be provided to be a component of the optical system.

The cooling elements 2 preferably each have connectors 2*a* for inlet and outlet of a liquid coolant that flows through the cooling elements in order to dissipate the heat. The coolant can be present in a closed cycle and release the heat in another place via a heat exchanger. The heat power to be dissipated in the case of the present lamp is on the order of significantly more than 1 kW.

Figure 2:
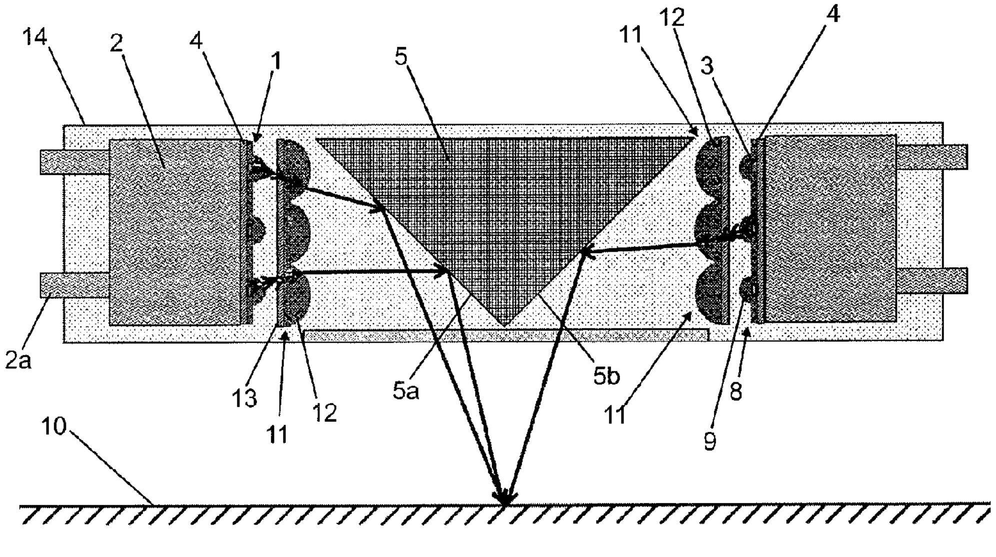
FIG. 2 is a schematic cross-sectional side view of a second exemplary embodiment of the invention.

The second exemplary embodiment according to FIG. 2 differs from the first example in that, in addition to the primary optical system 8, a secondary optical system 11 is provided upstream of each of the modules, which further improves the bundling of an exit angle of the LEDs that is as large as possible into the structure on the target surface. It is self-evident in this context that the primary optical system 8, in accordance with the combined effect of the secondary optical system 11, can have a different design in terms of size and focuses of lenses 9 than in the first example, while otherwise being built according to the same principle.

The secondary optical systems 11 are each situated at a distance upstream from one of the modules 1, but between the module 1 and the respective reflector plane 5*a*, 5*b*, in order to have a bundling effect on the optical path as early as possible.

The secondary optical systems each comprise multiple parallel cylindrical lenses 12 that extend in the longitudinal direction. Accordingly, at least the light from one row of LEDs is each captured by one of the cylinder lenses 12 and bundled into the line and/or structure of the target surface 10 (printed matter). Three different beams of light of three LEDs are each drawn at different emission angles in FIG. 2 in exemplary manner and are all bundled into the structure in the target surface.

Presently, the primary optical systems are manufactured according to a method whose principles are described in WO 2012/031703 A1 through coating the COB modules with silicone in an open casting mold. The present secondary optical systems 11 are manufactured according to an analogous procedure, in which a transparent planar substrate 13, rather than the COB modules, is coated with UV-resistant silicone in order to generate the optically active structures 12 (cylindrical lenses).

A lamp according to the exemplary embodiments described above is used for UV drying lacquer and/or paint in a printing machine, in an offset sheet printing press in the present case. An extension of the lamp in the longitudinal direction typically is more than 1 meter, specifically 1.6 meters in the present case, which corresponds to the sheet width of the printed matter. Typically, in order to implement these lengths, multiple modules 1 and optical systems 8 are arranged one after the other in the longitudinal direction.

The lamp components described above are accommodated in a housing 14 that is optimized with respect to the installation space.

An irradiation intensity on the target surface with respect to the longitudinal direction is approximately 10 Watts per cm in the present case. In this context, most of the light is in a wavelength range below 470 nm.

In order to manufacture LED lamps with very high optical output power, LEDs of a size of 0.1-200 $mm^2$, typically 1-2 $mm^2$, are assembled through the chip-on-board procedure (COB). In this context, multiple LEDs, typically 4-200 chips, are assembled into a module on a common substrate having a surface area on the order of 5 to 50 $cm^2$. The desired lamp length is then generated by placing modules configured with LEDs in series.

The heat loss arising during operation, which is caused by the efficiency of the LEDs being less than 100% (optical output power relative to supplied electrical power; less than 100%, typically 5-60% for UV-A and blue LED chips), must be dissipated by the cooling elements acting as a cooling system.

The cooling elements 8 cooled by liquid are three-dimensional bodies that possess a flat side on which the substrates are attached. The cooling element 8 can be fully hollow on the inside or can possess a channel or micro-channel system. The finer the structure inside the cooling element 8, the larger the common surface of cooling element and coolant by which the heat from the system can be transferred to the coolant.

This layout, which comprises the COB modules 1 up to the cooling system and is required to protect the lamp from overheating in operation, defines the installed height of the lamp, for technical reasons, between the emission plane of the modules and the final plane of the cooling elements 8. For given light power requirements of the lamp, this leads to minimal overall installed heights in emission direction of the modules 1 of up to 20 cm in a typical case. In many applications, such as, e.g., in sheet-fed printing by means of UV-cured paints and inks, lamps of this installed height cannot be used since the available assembly space in the machine is insufficient, e.g., because grasping systems conveying the sheets limit the available assembly space.

The arrangement of modules 1 and reflector 5 according to an embodiment of the invention as described above allows the installed height for a lamp of the requisite power density to be reduced significantly. The lamp according to an embodiment of the invention meets the requirements for implementation of an LED drier (LED lamp) having high specific optical power (emitted total power of greater than 10 W per cm of length) that combines the needs of efficient cooling and an efficient optical system for attaining high peak irradiation intensities (greater than 2 $W/cm^2$, at greater than 40 mm distance, with target values of 4-10 $W/cm^2$ at distances of 40-100 mm between lamp and target plane) while comprising a low installed height of less than 80 mm in the exit direction.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A lamp comprising:

at least one cooling element (2), a first module (1) and at least one second module (1) each having a plurality of LEDs (3) distributed over a module surface thereof, the modules (1) being arranged on the at least one cooling element (2) for dissipation of lost heat, a reflector (5), wherein light emitted by one of the modules (1) is deflected by the reflector (5) into an exit opening (6) of the lamp, and an optical system (8, 9, 11, 12) located between at least some of the LEDs (3) and the exit opening (6), through which light emitted by the LEDs (3) is bundled into a defined structure on a target surface (10), the optical system including a secondary optical system (11, 12) spatially separated from the modules (1).

2. The lamp according to claim 1, wherein the optical system comprises a primary optical system (8, 9) arranged directly on the LEDs (3), for bundling the emitted light.

3. The lamp according to claim 2, wherein the primary optical system (8, 9) is a transparent polymer layer applied to the modules, extending as a single part over at least multiple LEDs (3).

4. The lamp according to claim 1, wherein the secondary optical system is arranged in an optical path of the light.

5. The lamp according to claim 4, wherein the secondary optical system (11, 12) is a transparent polymer layer on a transparent substrate (13).

6. The lamp according to claim 1, wherein the optical system comprises at least one cylindrical lens (12) by which the light emitted from the plurality of LEDs (3) arranged in a row is bundleable.

7. The lamp according to claim 1, wherein the defined structure is a straight line.

8. The lamp according to claim 7, wherein the lamp extends parallel to said line in a longitudinal direction and has a length in said direction that is at least two times an installed height of the lamp in an upward direction that is perpendicular to the longitudinal direction.

9. The lamp according to claim 7, wherein the reflector (5a, 5b) is located opposite from a respective one of the modules (1) at an angle between 30° and 60°.

10. The lamp according to claim 1, wherein an irradiation intensity on the structure is at least 2 W/cm$^2$.

11. The lamp according to claim 1, wherein at least 50% of the light emitted by the LEDs (3) is in a wavelength range below 470 nm.

12. The lamp according to claim 1, wherein at least 50% of the light emitted by the LEDs (3) is in a wavelength range above 780 nm.

13. The lamp according to claim 1, wherein an amount of heat transferred to the at least one cooling element (2) is taken up by a liquid coolant.

14. A device for drying a coating, comprising a lamp according to claim 1.

15. The device according to claim 14, wherein a two-dimensional substrate bearing the coating to be dried and the lamp are movable toward each other in a conveying direction, such that the lamp extends at least partly over a width of the substrate in a transverse direction and is arranged at a defined distance above the substrate.

16. A method of drying a coating, using a lamp of claim 1.

17. The method of claim 16, wherein the drying step is part of a printing procedure.

* * * * *